United States Patent [19]

Long et al.

[11] Patent Number: 5,119,175
[45] Date of Patent: Jun. 2, 1992

[54] HIGH POWER DENSITY SOLID-STATE, INSULATING COOLANT MODULE

[75] Inventors: Lawrence J. Long, Crafton; James A. Hendrickson, Freedom, both of Pa.

[73] Assignee: Westinghouse Electric Corp., Pittsburgh, Pa.

[21] Appl. No.: 569,107

[22] Filed: Aug. 17, 1990

[51] Int. Cl.⁵ ............................................. H01L 25/04
[52] U.S. Cl. .................................... 357/82; 357/55; 357/76; 357/79
[58] Field of Search ............. 357/82, 55, 82, 76, 357/79

[56] References Cited

U.S. PATENT DOCUMENTS

| | | | |
|---|---|---|---|
| 2,824,977 | 2/1958 | Pankove | 357/55 |
| 3,007,119 | 10/1961 | Barditch | 357/55 |
| 4,268,850 | 5/1981 | Lazarck et al. | 357/82 |
| 4,896,062 | 1/1990 | Pollard | 357/76 |
| 4,910,642 | 3/1990 | Downing | 357/82 |
| 4,956,696 | 9/1990 | Hoppe et al. | 357/79 |
| 4,956,746 | 9/1990 | Gates, Jr. et al. | 357/82 |
| 4,963,976 | 10/1990 | Fluegel et al. | 357/82 |
| 4,965,658 | 10/1990 | Norbeck et al. | 357/82 |
| 4,984,066 | 1/1991 | Iversen | 357/82 |
| 5,003,376 | 3/1991 | Iversen | 357/82 |
| 5,016,088 | 5/1991 | Ermilov et al. | 357/76 |

Primary Examiner—Andrew J. James
Assistant Examiner—Daniel N. Russell
Attorney, Agent, or Firm—J. L. Brzuszek

[57] ABSTRACT

A high power density semiconductor module of reduced size and weight wherein a fusion element assembly for meeting electrical power processing requirements is nested in a hollow casing for both electrically insulating and operatively cooling by a single fluid medium. A pair of electrically conductive terminals penetrates the casing at opposite ends to make an electrical path through the fusion element assembly which resides within the casing as a stack in which each semiconductor fusion element is interleaved with plural heat sink elements undergoing a uniform compressive loading parameter. The stack is electrically insulated and cooled through transverse grooves in the fusion element assembly, which in one embodiment for space based utilization, is by way of finned heat sink or backing plate elements for passaging a dual function cryogen fluid such as supercritical liquid hydrogen. A terrestrial aviation or marine based utilization, provides that an ester base cooling oil having good dielectric properties may be instead used.

23 Claims, 5 Drawing Sheets

HIGH POWER DENSITY SOLID-STATE, INSULATING COOLANT MODULE

CROSS REFERENCE TO OTHER APPLICATIONS

The present application is related to the following concurrently filed U.S. patent application Ser. No. 07/569,113, filed Aug. 6, 1990, by L. J. Long, R. M. Calfo, and E. J. Shestak and entitled "Power Semiconductor Assembly With Lightweight Semiconductor Stacks" (W.E. 55,515).

BACKGROUND OF THE INVENTION

This invention relates in general to high power, semiconductor modules for electrical power generator assemblies, and more particularly, to mobile vehicle electrical generators which are relegated to an insulator fluid coolant for dual functional protection of electrical breakdown isolation and superior heat transfer from the electrical semiconductor fusion elements.

The invention is particularly applicable to aviation, marine, and space mission electrical power generation requirements where consideration of weight, volume, lubricating and cooling fluids becomes problematical because of the volume and weight competition with payload and propellants. This is especially true for extended orbital missions and also for non-recurrent space based missions where there is little or no possibility for rendering a refueling. The barriers presented to successful operations may also be viewed in terms of the measurable powered lifting cost per pound or kilogram of equipment.

Commercial aviation apparatus redundancy for uninterrupted cyclic airport operations, lifting capacity limitations and the expansion of the number of passenger seat miles flown per annum, safely and dependably with economy of operations, are important considerations for all aviation airframe operators. The aviation operations for the government of the U.S., as well as that of other mobile governments in the world, are perceived to be no less demanding in favoring the satisfaction of these requirements. The satisfaction of all of these requirements are usually met with multi-engined aircraft operated such that each engine can be used to power a separate generator system with each generator being capable of fulfilling the entire electrical power output needs for the aircraft.

Each generator system incorporates static electrical power conversion elements which constitute a converter bank of rectifiers in an inverter unit. This unit along with the other units i.e., conversion, filter, heat exchanger and control modules for the generator system, occupies physical space up to a limit usually determined by that available within each engine nacelle assigned space. The weight of same substantially contributes to wing loading up to the capacity of the original gross take-off weight as well as the landing weight. This equipment is relatively fixed over the course of each cycle of departure and landing operations.

In marine utilization of electrical power generators, weight and volume of components are likewise relevant in a set of criteria which dramatize safety and dependability of operations. The size of the payload and coolant tank competition with fuel load are not such apparent competing factors, however, it is possible to perceive that these factors are more relevant when agility and speed in the water are overriding goals, as with the U.S. Navy for both surface and undersea operations. The determination to achieve the maximum power output capability relative to the weight of the unit provides a goal oriented approach to updating components. This leads to downsizing the necessary onboard space and displacement which are part of the design criterion of marine engineering. Another concern is for the retrofitting or replacement of components that are not readily adapted to be changed, and avoiding long periods of shutdown at dockside from the inevitable failures which can occur while at sea, unless this can be postponed or otherwise dealt with by other measures.

Another very special set of design criterion and operational relationships is yet to be completely satisfied for space mission electrical power generation. This is with regard to space based activities such as orbital stations which have some of the same type of problems as do the aviation and marine utilizations. The rule is for more limited replacement capabilities if any are to be provided, and assuredly, if there is not a built in modularity it is with far greater difficulty and expense. Even more severe requirements are set for inherently more expendable type facilities in space that are intended to have limited human maintenance or no visitation over the course of useful life. There can only be remote direction for so long as there is electrical power generation aboard these facilities. The cost of launching any type of nontended satellite still factors the useful payload and supply of rocket propulsion and other fuels as strong competitive factors to limit the size and weight requirements of the electrical power support system. In this type of space environment, rocket fuel is an expendable which is metered and conserved over the course of the mission, but it has not been extended to be useful in all other respects despite its major bulk and weight in the launch systems.

High power semiconductor stacks for electrical power processing assemblies are of the type that produce kilowatts of power, and extend into the range of producing megawatts of power. Currently these are constructed with stacks of large, heavy, high power semiconductor devices, such as versatile "Hockey Puck" packaged fusion elements rated in size according to the electrical power rating with their associated mounting, cooling, insulating and auxiliary systems.

The presently available liquid or water cooled hardware assemblies are too large and heavy for either near or far space mission utilization, and not even projected increases in the electrical rating of these devices will make them attractive for space hardware. There is a limited capacity of electrical power processing requirements which is served by the present technology, but the needs for aerospace, terrestrial aviation, as well as marine requirements will be better served with new and improved high power semiconductor modules for power generator assemblies.

High power semiconductor devices with fluid cooled heat sinks of the type to which the present invention pertain may be seen with reference to U.S. Pat. No. 4,268,850. This reference teaches that a pair of manifolds for containing the flow of a cooling fluid allows for selective interconnection of the interior passageways of heat sinks having adjustable configurable internal fluid passageways. These passageways are used for forced vaporization cooling of contiguous thyristors and other semiconductor devices mounted in a hockey puck package and capable of switching currents of thousands of amperes, particularly in the transmission and distribution of electric power. One of the problems associated with this type of semiconductor assembly is that it does not maximize the dissipation of heat from the hockey puck's internal electrical element which in this case is a thyristor represented as a black horizontal line within the exterior casing elements.

All of the attendant problems of excessive physical size and weight are inherent when hockey puck semiconductors are employed in a vertical stacking assembly which necessitates a levered bolt compression apparatus. This adds to the physical bulk of the stack since it exists to have a larger physical dimension diametrically, and also, it supersedes the length of the stack of devices and heat sinks. The attendant problem of stack assembling is time consuming and tedious because of the apportionment of leveraged torquing between two or more transversely placed bolts used to apply the compression loading.

Another problem with this arrangement is that it does not provide the most efficient heat transfer from the semiconductor electrical function which results from it being cloistered within the exterior support components of the hockey puck. It is thus twice removed from the cooling oil or other medium which is employed for heat dissipation because the transfer must be made to the external intermediate components. This increases the device temperature which results in a lower rating for the device being developed for a given electrical power. Shortening the life of the electrical components results when excessive heat occurs. Replacements are needed, and this is never a desirable situation, especially when the stack of semiconductor elements is not unitized or contained in a packaged module so as to facilitate ease of replacement if some component of the assembly should fail.

SUMMARY OF THE INVENTION

In accordance with the present invention, a power semiconductor module is provided for a semiconductor fusion element assembly with interleaved heat sink elements, and this assembly is packaged into a modular stack unit which is insertable into an insulative casing with compressive preloading. It then makes electrical contact at each end with terminal elements passing through the casing to exterior terminals outside of the casing. This provides for electrical function to occur while being nested for operative cooling within the casing, and cooling is provided by a circulated dual function coolant which also serves as an electrical insulating medium to inhibit electrical breakover between the semiconductor fusion elements.

The power semiconductor module generally comprises an integral surface shell forming an insulative casing with one end being closed about one electrical terminal and the other end being sealed with a leak tight, resealable cover assembly including another electrical terminal to provide an electrical contact path through the modular stack unit. This occurs after being inserted into the casing, with the elements of the stack unit undergoing uniform compression on it's facing surfaces of semiconductor fusion and heat sink elements.

The casing is formed with inner side walls having sufficient clearance with respect to the sides of the inserted modular stack unit for a pressurized fluid to transfer the heat from the operation of the electrical fusion elements. This transfer through the clearance passages is in a circulation path from an inlet port inserted on a portion of the casing to an outlet port displaced from the inlet port on a portion of the casing. The fluid is chosen to have a combined efficacy for cooling and electrically insulating the modular stack, and thus, for aerospace operations where a cryogen is already present, it can be used for circulation before being expended for propulsion purposes. One such fuel is, for example, supercritical liquid Hydrogen. As for aviation and marine operations, an ester base lubricating oil having good dielectric properties and recirculation heat transfer properties can be used.

In accordance with another aspect of the invention, the modular stack unit for the semiconductor module is assembled with a preloadable centralized clamping apparatus inserted through each fusion element associated with a pair of heat sink elements which may have fins for cooling purposes. The fusion elements are polarized wafer thin semiconductor elements bonded on one surface to a metal backing plate member, and the backing plate member, in one embodiment, having one or more transverse grooves or channels traversing it's outer face in order to transfer the fluid under pressure through the core of the modular stack for a greatly improved electrical fusion heat transfer characteristic which allows operation in the megawatt power range.

In accordance with another aspect of the invention, the one or more transverse grooves through the exterior face of the backing plate member are radial channels in the backing plate of a fusion element which emanate from a central aperture formatted into the semiconductor during the fabrication process, and this is in alignment with a central aperture formed in the backing plate to which the semiconductor is bonded.

In accordance with yet another aspect of the invention, at least one heat sink element is formed of a porous metal foam in a rigid supporting configuration to withstand the compressive loading of the stack unit within the casing. This allows the passage of the circulating fluid through the core of the modular stack in order to transfer the heat to the external environment. In another configuration, one or more of the heat sink elements formed of the porous foam may be centrally apertured while providing a supporting configuration to withstand the compressive loading of the stack unit within the casing and thereby to transfer the single fluid under a pressure head through the central aperture. The clearance from the interior shell of the casing allows passage of the fluid through the core of the modular stack.

Another aspect, according to the invention, provides that one or more heat sink members are formed having one or more transverse grooves traversing one or more of it's outer faces. The face of the grooved heat sink element interfaces one of the surfaces of the polarized semiconductor element in order to transfer the fluid under a pressure head, communicating through the clearance from the interior shell of the casing, so as to pass through the core of the modular stack and provide more effective heat transfer from the semiconductor fusion to the environment outside of the semiconductor module. The transverse grooves in the heat sink member are in one surface or both surfaces and may be in parallel channels on one or both of the sides and laterally extending from one side extent to the other side extent. One or more grooves on one face are offset with respect to the one or more grooves on the other face of the heat sink member.

Another aspect, according to the invention, provides that one or more heat sink members are formed having one or more transverse grooves in radial channels from a central aperture formed into the heat sink member in alignment with a central aperture formatted in the fabrication of the polarized semiconductor. This central aperture is also in alignment with a central aperture formed in the backing plate to which the semiconductor is bonded. Interfacing one or more of the heat sink members outer faces with the face of one or the other of the surfaces of contiguous polarized semiconductor elements transfers the fluid under a pressure head which communicates through the clearance from the interior shell of the casing, so as to pass through the core of the modular stack. This arrangement also provides more effective heat transfer from the semiconductor fusion to the environment outside of the semiconductor module. The transverse grooves in the heat sink member one surface or both surfaces are radial channels on one or both of the sides and radially extending from the central aperture to the other side extent, with the one or more channels on one face being offset in degrees with respect to the one or more channels on the other face of the heat sink member.

BRIEF DESCRIPTION OF THE DRAWINGS

The invention may be better understood, and further advantages and uses thereof more readily apparent, when considered in view of the following detailed description of exemplary embodiments taken with the accompanying drawings in which.

DETAILED DESCRIPTION OF THE PREFERRED EMBODIMENTS

The invention is a new and improved power semiconductor module of reduced size and weight packaging for nesting a fusion element assembly in order to provide for electrically insulating and operatively cooling one or more semiconductor fusion elements with a single fluid which may be chosen from a broad list of cryogens, insulative oils, and even water in some instances. This broadly innovative module creates an opportune containment for utilizing a cryogen, typically supercritical liquid hydrogen as a functional coolant and extra ordinary electrical insulator, which eludes having any known precedent. The fusion element is of the type previously packaged within a "Hockey Puck" semiconductor package, although it is removed from an individual package and consolidated into a modular stack unit, with one or more heat sink elements in the semiconductor fusion element being brought into direct heat transfer contact relationship with the dual function cooling fluid in order to operate with an increased electrical power rating.

Three of the principal requirements for increasing the power rating of a semiconductor module for use in electrical power systems are satisfied by the present invention. The first is that each of the semiconductor fusion elements is compressively positioned in a stack with a nearly uniform force being applied to its entire electrical contact face in order to provide for electrical and mechanical integrity and superior thermal transfer efficiency. This avoids hot spots and operatively cools the modular stack at rated KVA levels and above. Another requirement is that the mounting structure minimizes the clamping and mounting hardware needed for compressing the fusion elements in an immovable position with respect to the stack assembly. The third is minimizing or eliminating the need for electrical circuit compensation for the purpose of balancing the static and dynamic electrical performance characteristics of the stack.

The components eliminated are the individual "Hockey Puck" packaging, the non-integral clamping and mounting hardware for compression and the non-essential or larger size of the compensating electric network elements. A power semiconductor module, according to the invention, minimizes the comparatively colossal size and weight which is normally associated with a power semiconductor assembly.

A need exists for some relevant examples of power semiconductor assemblies with lightweight semiconductor fusion elements interleaved with heat sink elements which are compressively loaded to apply uniform facing pressure through a modular stack unit which is suitable for use in the power semiconductor module. According to the present invention, the subject matter that is relevant is for a related, concurrently filed co-pending U.S. patent application Ser. No. (W.E. 55,515). This application is assigned to the same assignee as the present invention, and it is hereby incorporated by reference into the present application and will be hereinafter referred to as the incorporated U.S. application. It is characteristic of the improvement that can be realized in size and weight reduction with an advantage of as much as 15:1 in size and weight of the semiconductor stack compared to the ones done according to the traditional technology.

Figure 1:
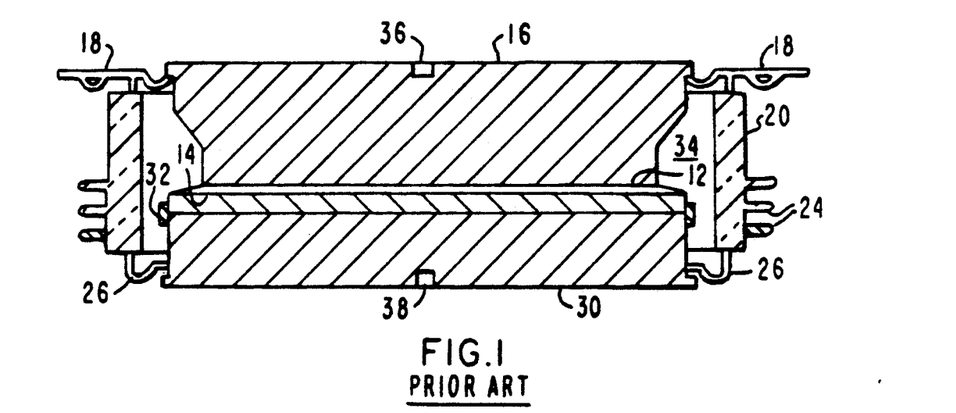
FIG. 1 is an elevational view showing an enlarged and partially cross-sectioned, prior art single "Hockey Puck" with a conventional fusion element central to the interior thereof.

Referring now to the drawings, FIG. 1 is an enlarged prior art view of a single "Hockey Puck" semiconductor element 10, known as a packaged unit. The heart of the electrical operation is conducted through a semiconductor fusion element 12 which is mounted on a fusion backing plate 14 which provides rigidity and support for the paper thin polarized wafer which constitutes the semiconductor fusion element 12. The rest of the semiconductor element 10 is the packaging unit which provides the mechanical mounting for the fusion element 12, heat transfer path from the fusion element to an external heat sink, and an electrical insulation breakdown strength for the fusion element 12.

The mechanical mounting is provided by a pair of metal pole pieces 16, 30, with the inner surface of the lower pole piece 30 forming a transferring contact electrical surface relationship with the downward facing surface of the fusion backing plate 14. The downward facing surface of the pole piece 16 forms a mating relationship with the semiconductor fusion element 12, and the design of the semiconductor package unit is such that a compressive force of 1000 pounds per square inch (psi) or greater may be applied between the pole pieces 16, 30. This force will cause a seating of the inner surfaces of these pole pieces on the wafer semiconductor fusion element 12 and its backing plate 14 sufficient so that electrical resistance is minimized and heat transfer is carried out. The surfaces of the semiconductor fusion 12, 14 may be coated with a precious metal such as gold on one surface and silver on the other surface. The same coating is needed but not normally done on the outwardly facing surfaces of the pole pieces 16, 30.

A ceramic insulator barrel 20, shown in cross section in FIG. 1 has a structure with ridges or fins 24 which are not very efficient cooling fins. The fins 24 also have a design characteristic to expand the voltage gradient applied between the pair of metal pole pieces 16, 30. Concentric with the fins 24 inside the package, a contact alignment band 32 mechanically constrains the semiconductor fusion element 12 through its backing plate 14 to a limited amount of transverse movement in the plane of the paper. Similar constraint occurs on an axis normal to the plane of the paper on which movement is confined to the limit with the annular volume of space 34 which may be filled with an inert dry gas such as Nitrogen. An upper belt plate 18 and a lower belt plate 26, provide a seal for this annular volume of space 34. These belt plates 18, 26 surround the metal pole pieces 16, 30 at each end, and each of the belt plates 18, 26 are connected to the ceramic insulator 20 in order to completely surround the semiconductor fusion element 12 in a sealed environment for same. Pole piece 16 has a center alignment crevice 36 and a similar crevice 38 is used for pole piece 30 in order to align it with central alignment pivots (not shown). Heat sink elements normally occupy the space immediately above and below it, respectively.

The semiconductor element 10 is normally interleaved between heat sinks of roughly the same or greater diametric size. Compressive holding forces of 1000 to 2000 psi or greater are used, and voltages range from hundreds of volts to 5000 volts or greater in some power generation systems. This prior art assembly mode occupies a volume of space, typically measured to be approximately 1 ft. (30.5 cm) square by 1 ½ ft. (45.7 cm) high. These measurements indicate that roughly 1.5 cu. ft. (0.04 cu m) needs to be available for a present state of the art, high voltage, rectifier stack. This is rated at about 10 KV and 3 KA, for a power rating of 30 MW (Megawatt) with the rectifier stack unit being available from Powerex Corporation of the United States. A component such as this, according to the present ratio of weight to power output calculations, using a ratio of 13 KG/MW for a state of the art multimegawatt unit, tips the scales at a hefty 390 KG (860 lbs) for the 30 MW system mentioned above. Since this unit is characteristic of one of several units which normally would be present in the system in order to provide various stages of rectification and switching using crowbars, inverters and converters, and semiconductor diodes of various sizes. Likewise, with switching devices such as transistors and Silicon Control Rectifiers (SCR), the stacking, clamping, mounting and cooling systems for each stage is a burden to the overall capacity of the system.

It has devolved upon these inventors to implement the clear antecedent goal to provide a power semiconductor module of universal character which is applicable to present and future aviation and marine requirements as well as to space mission electrical power system requirements. Weight, volume, and a mix of available functional insulating and cooling fluids compete with the payload and propellants. The invention yields a volume reduction of approximately 5:1 and a weight reduction of approximately 10:1, a power increase of 2:1 and a corresponding power density increase of 100:1 power output. This is compared to the present technology with devices in packages used with cold plate cooling technology, as characterized by the "Hockey Puck" packaging.

Figure 2:
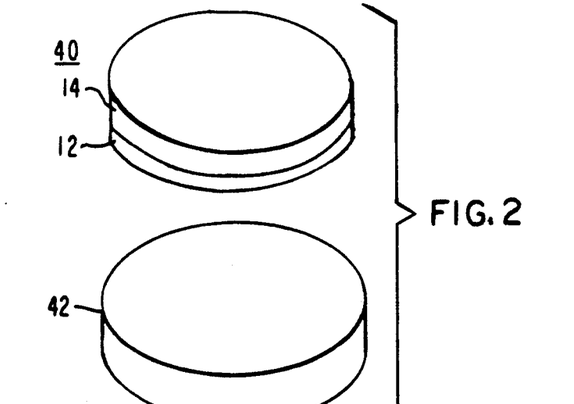
FIG. 2 is a perspective showing of a fusion element with a polarized wafer of semiconductor material bonded to a metallic backing plate member located above a common heat sink element to which the outward facing surface of the fusion element is interfaced.

Referring to FIG. 2 for its perspective showing of an unpackaged semiconductor fusion 40 having a fusion element 12 which has been fabricated for assembly and operation at rated KVA levels of twice the normal rating. This is realized by directly immersing the devices in a fluid selected for its electrical insulation and cooling characteristics. This occurs characteristically only when the operational environment is one of direct heat transfer, as stated. The semiconductor fusion element 12 is bonded to a backing plate 14, and a specialized voltage breakover design characteristic is formatted into the fusion element 12. The downwardly facing surface constitutes the modified semiconductor fusion element 12 which prevents voltage breakover between the two oppositely polarized semiconductor layers.

The formatting of the semiconductor wafer 12 is what enables it to be used, according to this invention, and this is a state of the art technique which is used in the fabrication of an active semiconductor fusion. This is performed for the assignee by Powerex Corporation of the United States. The technique is to bevel the exposed semiconductor surface layer at its outer circumferential edge in order to prevent voltage breakdown by increasing the creep distance between the two oppositely polarized semiconductor layers. The volts per unit distance is lessened by increasing the distance over which the voltage breaks over between the opposite type semiconductor layers. After the beveled material is removed, an insulative varnish layer such as polyethylene or RTV is applied as a surface coat to the beveled region. This coating further enhances the prevention of breakover voltage when the fusion element is compressively merged with a heat sink element 42. Another approach used by Powerex Corporation for the present assignee is to fabricate the semiconductor fusion 12 so that the downwardly facing polarized layer is treated with a series of doped grading rings which are plural in number in order to compensate for the exposed edges of the planar semiconductor disk. Voltage breakover is prevented at the outer circumferential extent of the semiconductor fusion.

Proprietary formatting techniques of this assignee are involved in designing a fusion element assembly which is specifically suited for an operational environment in which these devices are operated. The direct immersion of the unpackaged semiconductor fusion 40 is contemplated with its fusion backing plate 14 which is made of metal such as molybdenum to which the semiconductor wafer 12 is bonded. One of the best insulative and cooling function fluids in the cryogen category including helium, hydrogen, neon and nitrogen, is supercritical liquid hydrogen $SLH_2$ at about 12 atmospheres. This is a rocket propellent expendable which is currently in use for space probes and planetary missions.

Figure 4A:
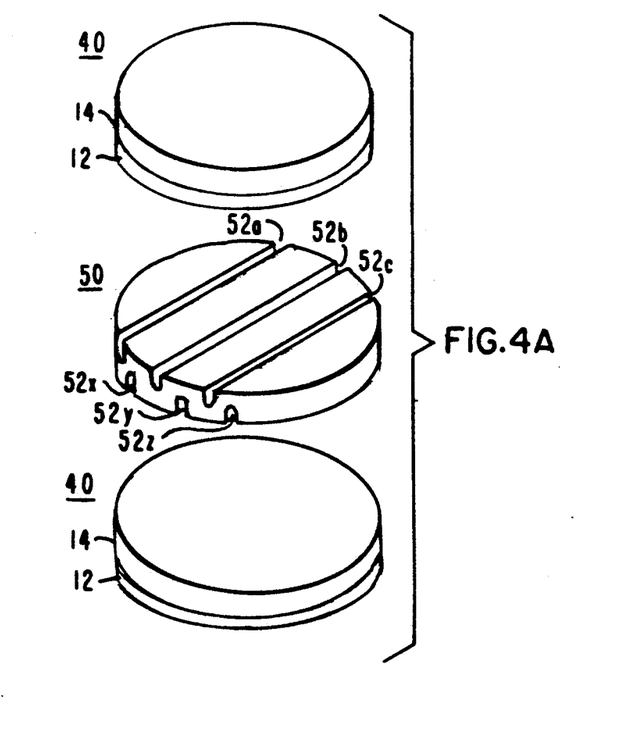
FIG. 4A is an exploded perspective showing of a heat sink member with sets of parallel transverse grooves extending across the upper and lower surfaces, positioned with respect to a pair of fusion elements which have one of their semiconductor surfaces, for each fusion element, interfacing in a stacked relationship according to the invention.
Figure 4B:
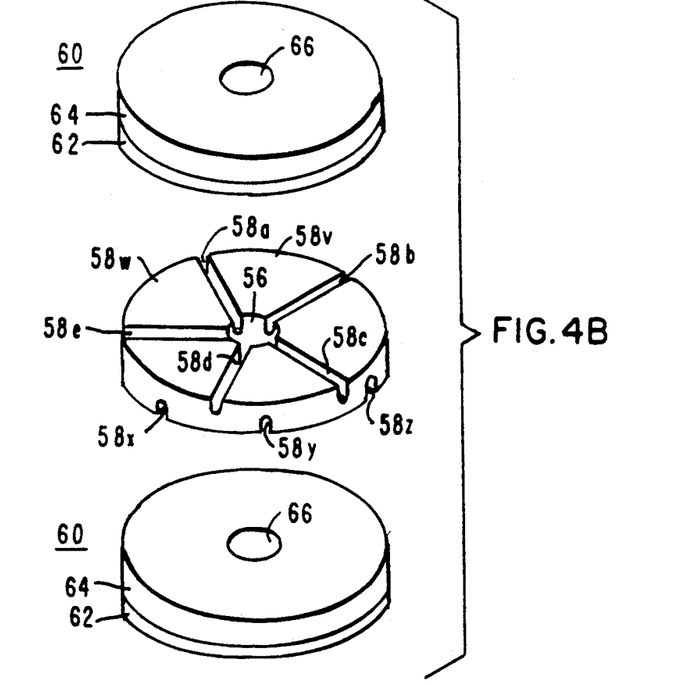
FIG. 4B is an exploded perspective showing of a heat sink element with sets of offset radial transverse grooves extending across the upper and lower surfaces from a central aperture positioned in alignment with respect to a pair of centrally apertured fusion elements which have one of their semiconductor surfaces, for each fusion element, interfacing in a stacked relationship according to the invention.
Figure 4C:
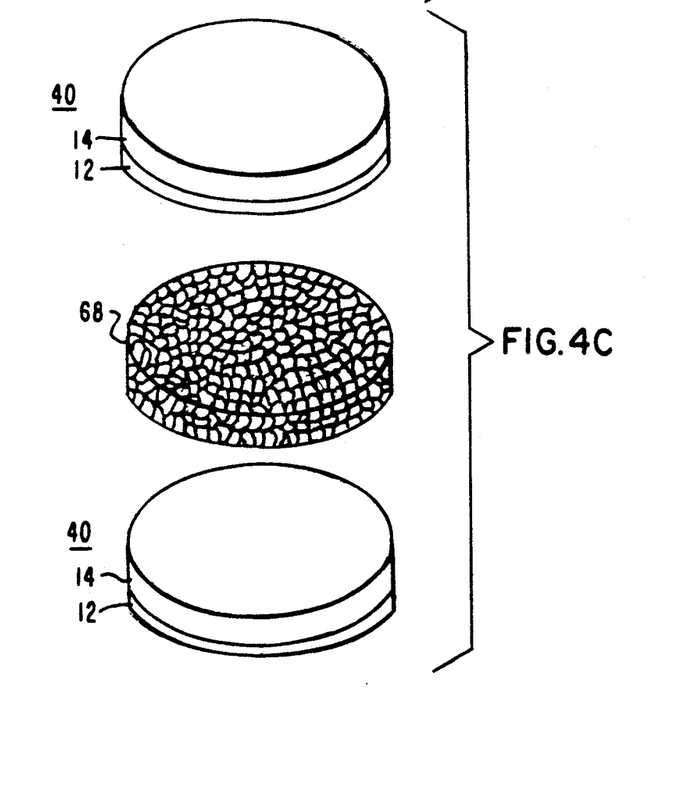
FIG. 4C is an exploded perspective showing of a heat sink member constructed of porous metal foam through which a transverse cooling fluid path occurs in traversing each outer surface in heat transfer contact with the semiconductor related surfaces for each fusion element interfacing in a stacked relationship according to the invention.
Figure 5A:
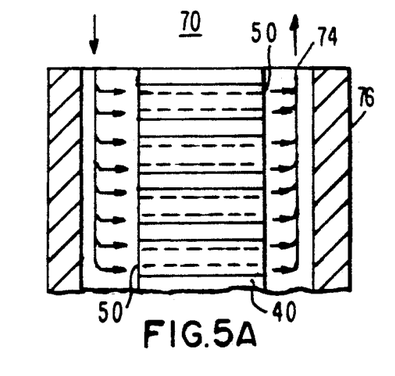
FIG. 5A is an elevational view partially in cross section showing a portion of a high power density module, according to the invention, with a stacked plurality of semiconductor fusion elements interleaved with a plurality of heat sink members, according to FIG. 4A, with sets of parallel staggered transverse grooves extending across the upper and lower surfaces of each of the heat sink members.
Figure 5B:
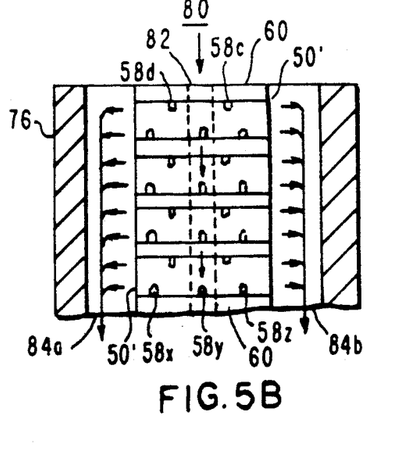
FIG. 5B is an elevational view partially in cross section showing a portion of a high power density module, according to the invention, with a stacked plurality of semiconductor fusion elements interleaved with a plurality of heat sink members, according to FIG. 4B, with sets of offset radial transverse grooves extending across the upper and lower surfaces of each of the heat sink members.
Figures 5C, 8:
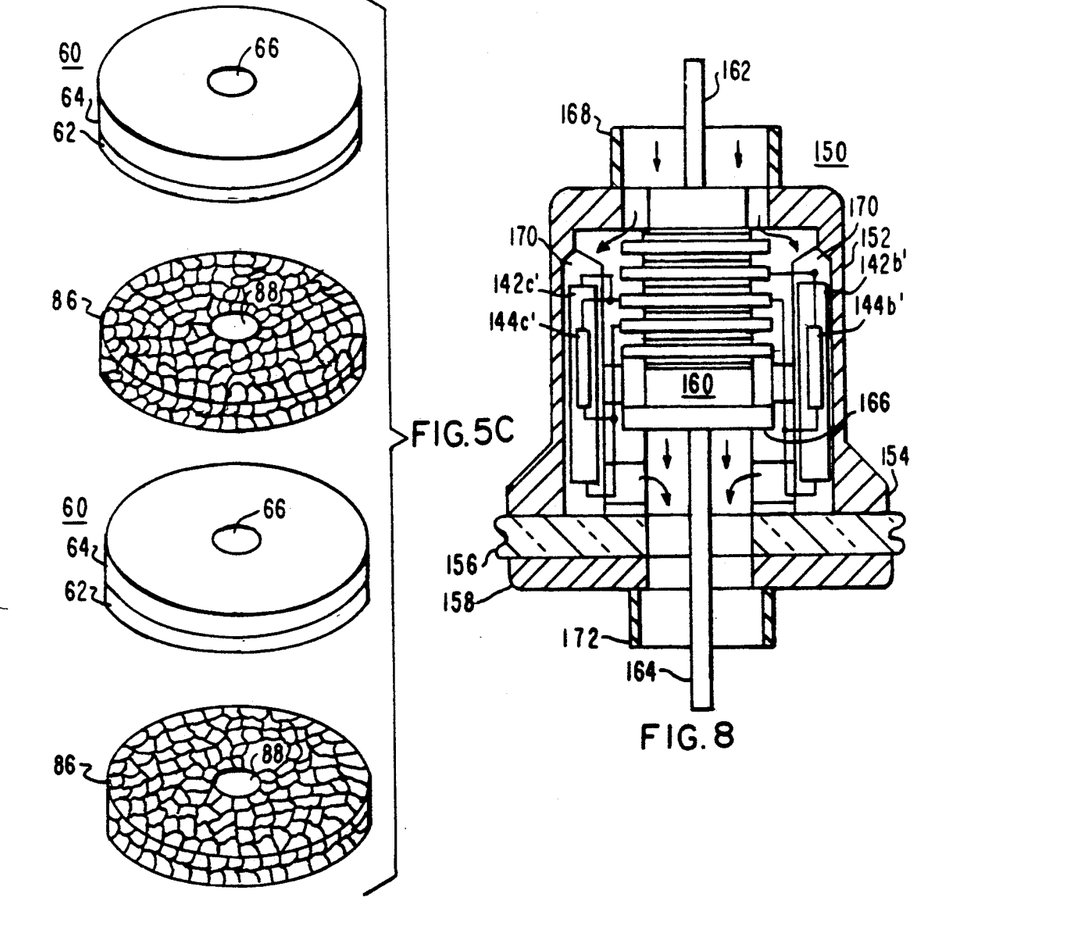
FIG. 5C is an exploded perspective showing of a heat sink member constructed of porous metel foam through which a radial cooling fluid path occurs in traversing from a central aperture in alignment with the central aperture formatted into the interfacing fusion elements in heat transfer contact with the semiconductor related surfaces for each fusion element interfacing in a stacked relationship similar to FIG. 5B according to the invention.
FIG. 8 is an elevational view, partially in cross-section, of an assembled high power density semiconductor module with axial coolant flow along annular concentric paths with the electrode axis, with cooling fluid flowing through the stack assembly through a radial path as shown in FIGS. 3B, 4B, 5B, and 5C, according to the invention.
Figure 6:
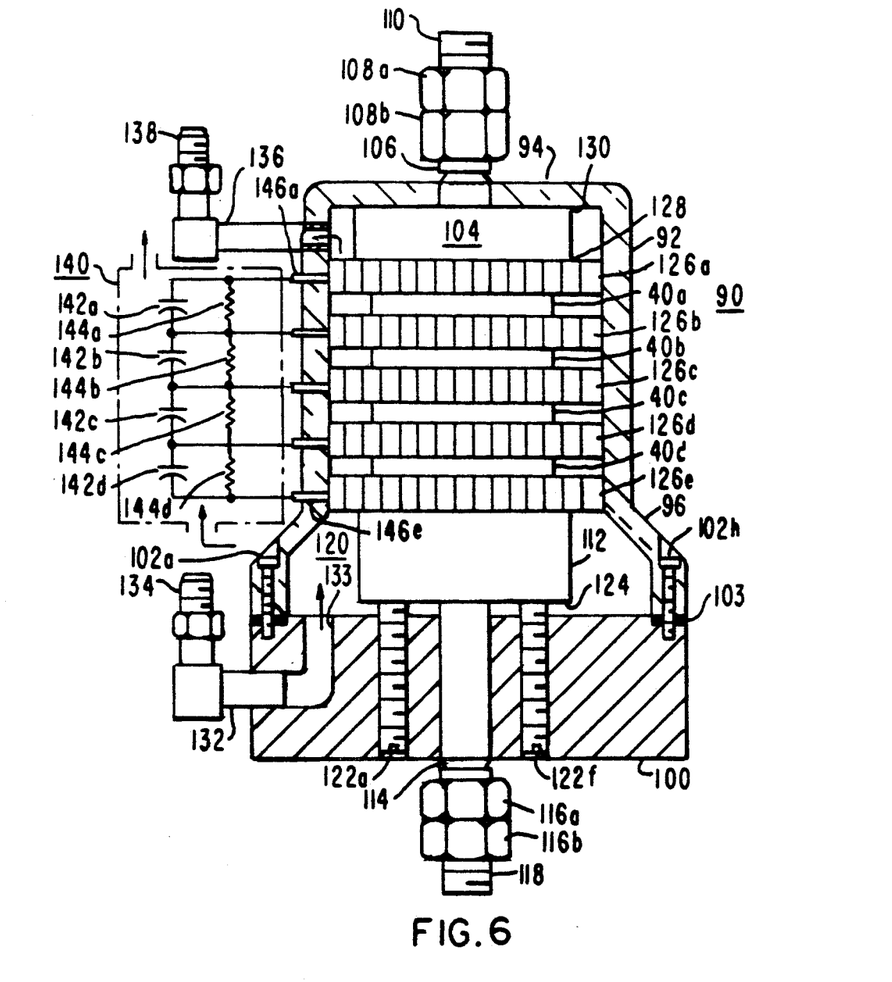
FIG. 6 is an elevational view, partially in cross-section, of an assembled high power density semiconductor module with axial coolant flow through finned heat sink elements along an annular concentric path with the electrode axis, and cooling fluid of oil or supercritical liquid hydrogen flowing through the stack assembly along the edges with the heat sink elements of the assembly.

It is with the option in mind to use $SLH_2$ for near and far space missions that the disclosure proceeds to describe the manner of further modifying the unpackaged semiconductor fusion 40 of FIG. 2, as specifically taught in FIGS. 3A, 3B, 5A, 5B and applicably in FIGS. 6 and 8. Likewise, and respectively, the heat sink element 40 of FIG. 2 is intended for use with $SLH_2$, specifically with FIGS. 4A, 4B, 4C, 5A, 5B, 5C, and applicably in FIGS. 6 and 8.

It can be equally said that for marine technology the same groupings of figures are applicable when using an electrically insulative cooling oil such as THERMINOL ™ and another by the name of FLUORINERT ™ which is specifically designed to be inert and not to affect the semiconductor or the passivation layer. It has already been mentioned that a list of oil coolants should include those used in the field of commercial aviation in order to satisfy the electrical generating requirements, and currently this includes ester based oils such as MIL-L-7808 or MIL-L-23699 cooling for direct impingement, as well as other oils which do not leave deposits or residues and don't carbonize.

Figure 3A:
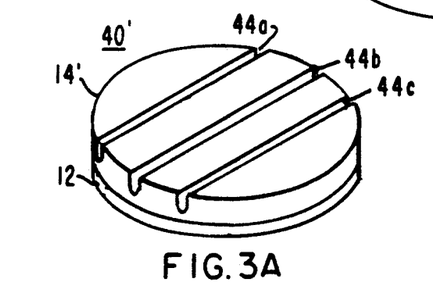
FIG. 3A and 3B are perspective showings of alternative fusion elements, according to the invention, in which transverse grooves are respectively shown in spaced parallel channels and in radially indexed channels across the surface of the backing plate of each fusion element.

FIG. 3A represents a modification of the unpackaged semiconductor fusion 40' in which transverse grooves or channels 44a, 44b, 44c traverse the fusion backing plate 14' in parallel rows which are spaced from each other across the upwardly facing surface thereof.

A proportionality is suggested by the diametric size of the unpackaged semiconductor fusions 40, which is that they represent approximately the diameter of a size #6 semiconductor unit fusion element which has a diameter of about 0.75 inch (1.9 cm) and is about 20 mils (0.5 mm) thick. Its supporting fusion backing plate 14 is another 60 mils (1.5 mm) thick for a combined total of 80 mils or 0.080 inches (2 mm). The depth of channel 44a in FIG. 3A is shown to be cut to a relative depth of about half of the thickness of the backing plate 14', which in this case, could be taken to be about 30 mils (.76 mm) deep. About the same dimension is used for a width of cut in the top surface. The additional grooves 44b, 44c are similarly dimensioned and are mutually parallel with respect thereto. The molybdenum backing plate 40' in this configuration can be used with or can replace the need for a separate heat sink element 42. The parallel channels 44 serve as cooling grooves through which a cryogen or low viscosity oil comes in direct surface contact with the fusion element.

Excellent thermal contact between the metallic material of the backing plate 14' serves to transfer the heat of the electrical fusion with a rating that upgrades the device by a factor within the range of 2.5:1. This is a multiplying factor of the upgrading type realized from the unpackaging of the semiconductor fusion and immersing it in the cooling fluid. Thereby, this factor serves as a multiplier for another factor within the range of 2:1 which is realized to encompass the use of cryogen coolants.

The thickness of the backing plate 14 was not increased for purposes of comparison with the unmodified version 40 as shown in FIG. 2. However, it is intended to increase groove depth in order to compensate for the viscosity of cooling oil used for direct oil cooling in the grooves 44, which would undergo a greater pressure drop than with $SLH_2$. This would require thickening of the backing plate to double or triple thickness to 120 or 180 mils (3 to 5 mm) thick or greater. This would be practical in order to provide grooves with a depth of about 1/16 inch or 62.5 mils (1.6 mm) to thereby facilitate the coolant flow with oil having good dielectric properties, but the backing plate could also become thicker when it is intended that no other heat sink be used.

The elimination of separate heat sink elements 42 is a simple but rewarding expedient which derives great savings in weight as well as providing increases in interior space for additional fusions and coolant or for further reductions in overall physical requirements by the elimination of a component which has persisted for the most part to date.

Figure 3B:
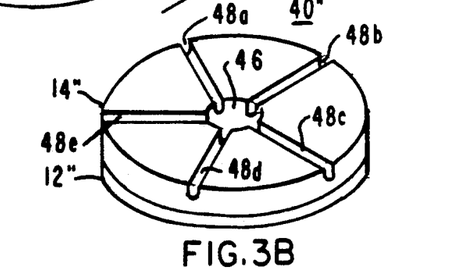

Another embodiment of the present invention is shown in FIG. 3B which represents a modified unpackaged semiconductor fusion 40" in which transfer grooves or channels 48a, 48b, 48c, 48d, 48e emanate from a central aperture 46 which may be a hole drilled through the backing plate 14" in its center in alignment with a central aperture in a modified semiconductor wafer 12". This is an extension of the concept disclosed in the subject matter for the related concurrently filed copending U.S. patent application Ser. No. 07/569,113, filed Aug. 6, 1990 (W.E. 55,515). The provision of the central aperture extending through the modified semiconductor wafer 12" is to provide a passage for active coolant flow which enters through the central hole 46 as a feed to each of the radial extending grooves or channels 48 which carry the pressurized coolant flow to the peripheral extent of the modified unpackaged semiconductor fusion 40". The grooved dimensions are comparable to those of the grooves 44 described in exemplary dimensional detail, and it is intended that similar depth and width may be used for the grooves of the inventive embodiment of FIG. 3B.

Subsequent portions of the description with respect to FIGS. 5A and 5B are described with equal applicability to modified heat sink members to show that the radial cooling flow pattern of these additional embodiments, such as FIG. 4B and 5C, have less need for effective seals as compared with FIG. 5A which does suggest the need for effective seals. Excellent cooling is thus provided without need for forced withdrawal through an exhaust cavity, since the natural predisposition of the cooling system in FIG. 5B is for the coolant to feed through the central cooling passage coolant inlet 82 as described subsequently with further reference to FIG. 5B.

Referring now to FIG. 4A which shows an exploded component arrangement interleaving a modified heat sink element 50 with a pair of semiconductor fusion elements 40, interfacing above and below with respect to the adjacently facing surfaces of the heat sink 50. The polarization of each of the semiconductor fusion elements 12 is serially disposed so that the oppositely polarized electrical surface 12 is a contact surface of the next polarized contact surface through the heat sink element 50. A set of upwardly facing parallel grooves or channels 52a, 52b, 52c extends across the upward facing surface, and a set of downwardly facing grooves or channels 52x, 52y, 52z likewise extend downward across the facing surface, each parallel with respect to each other. The upwardly facing grooves 52 are offset with respect to the downwardly facing grooves 52 on the oppositely facing surface of the modified heat sink member 50. These sets of grooves or channels in the opposite surface faces are dimensioned similarly in depth and width to those exemplary dimensions described with respect to the inventive embodiments of FIGS. 3A and 3B. The backing plate grooves 44 and 48 were represented therein in the backing plate member 14' and 14", respectively.

Normally, the heat sink element 50 is seen to have a greater thickness than the individual unpackaged semiconductor fusions 40, and, therefore, the grooves 52 may have a greater depth without structurally disturbing the rigidity and structural support characteristics for the compressive loading when the interleaved fusion element 50 is assembled into its fusion stack. The capability of withstanding a pressure of kilopounds psi is intended for its operative applicability in a semiconductor module yet to be described with respect to FIGS. 6 and 8.

The stack assembly of FIG. 4A is shown in a representative portion of an operational setting in FIG. 5A which is characteristic of a modular parallel transverse flow assembly 70. The transverse flow assembly 70 incorporates four units of the modified heat sink element 50 which are shown in elevation. The stacked assembly may be extended in the central core of a casing wall structure 76 which forms a inlet coolant cavity 72 and an outlet coolant cavity 74. There are five interleaved semiconductor fusion elements 40 of the unpackaged type in contiguous relationship with the modified heat sink elements 50. The upper and lower passages 52 are shown as dashed lines inside each of the heat sink elements 50 which are supplied from the left manifold of arrowheads entering through the inlet coolant cavity 72.

These flow patterns branch respectively through the channels in the heat sink elements to the outlet coolant cavity 74 which draws the dielectrically suitable cooling fluid away from the transverse flow assembly 70. The effluent is either to be cooled through a heat exchanger and recirculated or transferred to a device to expend the fluid if it is such as a cryogen useful for other purposes such as rocket propulsion. The coolant is pumped in through the inlet 72 and is exhausted through the outlet 74 after passing in parallel through all the heat sinks 50, and a sealed system as such is better designed to prevent excessive leakage across the edges of the fusion elements 40.

As an alternative to FIG. 5A, there is shown in FIG. 5B a modular radial transverse flow assembly 80 which is located centrally in a casing wall structure 76, as a portion of a power semiconductor module. A modified heat sink element 50' therein which is seen in perspective in FIG. 4B has an upwardly facing surface in which transverse radial grooves 58a, 58b, 58c, 58d, 58e are provided for the cooling passages associated with direct heat transfer for a pair of modified unpackaged semiconductor fusion elements 60 it is positioned between. The modified fusion element 60 includes a modified backing plate 64 which has a central aperture 66 in the form of a hole which is aligned with a similar central aperture formatted into the semiconductor fusion 62. This is the same fabrication technique that was described with respect to the modified semiconductor fusion 40" in FIG. 3B with the apparent exception that no grooves or channels are represented in the centrally apertured backing plate 64 as was the representation of grooves 48 in FIG. 3B.

A natural purpose for a grooved structure of the backing plate becomes evident when consideration next is focused on the set of radial grooves or channels 58x, 58y, 58z and the unseen grooves or channels 58v and 58w in FIG. 5B which reside in the bottom surface or the backwardly facing crescent of the heat sink member 50'. A mating or double depth grooved relationship can be readily provided with the interface of the modified heat sink element 50' with its downwardly facing surface in relation to a interfacing and similarly modified semiconductor fusion element 60 as numbered 40" in FIG. 3B.

Centrally placed apertures both 56 and 66, which in the backing plate 64 is 66, extends in alignment with a centrally apertured fusion element 62 therebelow.

It is within the purview of this disclosure that the combination of a modified fusion backing plate 14″, described with respect to FIG. 3B, can be used as an alternative to the lower semiconductor fusion 60 in the interleaved assembly of FIG. 4B. The downwardly facing grooves 58 of the modified heat sink element 50′, as radially indexed equal to the grooves or channels 48 correspondingly, are aligned, and the central aperture 46 in the unpackaged semiconductor fusion 40″ as modified in FIG. 3B, is in communication with 56. This arrangement provides double the depth for the combined grooves and this reduces the pressure head that would be associated with a single depth of grooves formed or cut into either only the heat sink element of FIG. 4B or the semiconductor backing plate element of FIG. 3B. This would be helpful when a more viscous coolant or oil is utilized instead of a cryogen which has an extremely low viscosity. A cryogen such as $SLH_2$ is able to flow through minute crevices under an extremely low pressure head of one or two psi pressure drop, as compared with that of about 10 psi for oil at the velocities of flow used for cooling.

The radial transverse flow assembly 80 of FIG. 5B has been mentioned previously with respect to the radially indexed channels of the unpackaged semiconductor element 40″ of FIG. 3B. This structure is similar in function for the coolant flow assembly of FIG. 4B as it has been described for the modified dual surface channel, heat sink element 50″ which is more directly represented as follows. FIG. 5B represents four interleaved heat sink cooling elements 50′ of the type modified with each having its central aperture 56 in alignment with five modified semiconductor fusion elements 60. These are assembled in a continuously expandable stack assembly central to the core of a casing wall structure 76 which represents a portion of the power semiconductor module. A central coolant inlet 82 is a collective representation of the aligned central core passage formed through the individual elements of the stack assembly. The coolant radially traverses from the central aperture of each modified heat sink element 50′ in direct heat transfer contact with the contiguous modified fusion element 60 in passing therethrough to an annular outlet cavity 84. The left side of the outlet cavity 84a and the right side 84b represent the unified functionally effective segments of the annular cavity in this cross-sectional illustration. The central coolant entry inlet 82 is pressure coupled to a source of coolant which is aided in this orientation by natural gravitational flow through the outlet cavities 84. This flow configuration does not suggest the need for a special sealing arrangement between the modified elements of the semiconductor stack, since the radial grooves or channels 58 for the heat sinks 50′ does not suggest possible leakage across the interfacing edges with the fusion elements 60.

FIG. 4C is a showing of another type of heat sink interleaved assembly in which a porous metal foam element 68 is formed into the shape of a rigid disk, and this is interleaved between a pair of unpackaged semiconductor fusion elements 40. A semiconductor fusion element 12 is bonded to a backing plate 14 in each unit on either side of the metal foam element 68, with the respective fusion element interfacing in relation to the correspondingly facing surface of the porous metal foam disk 68. The downwardly facing surface of the metal foam disk 68 interfaces with the fusion back plate surface 14 associated with the unpackaged semiconductor element 40, as described with respect to FIG. 2. The porous metal foam disk 68 provides semi-continuous coolant surface contact with the respective semiconductor fusion element surface 12 interfacing therewith. An implementation of the stack assembly of FIG. 4C fits the concept of modified parallel transverse flow in the assembly 70 shown in FIG. 5A. The porous metal foam heat sink elements 68 are substituted for the modified dual surface channel heat sinks 50 shown therein. A transverse flow of coolant entering through the inlet coolant cavity 72 passes through the porous metal foam disks 6 and is collected from the exhaust cavity 74 in the casing wall structure 76.

FIG. 5C provides an example of porous metal from heat sink elements 86 which have a central aperture or hole 88 aligned with a pair of modified semiconductor fusion elements 60. Each of the fusion elements 60 have aligned central apertures or holes 66, according to the assembly relationship described with respect to FIG. 4B, except for the replacement of the modified heat sink elements 50′ therein, with the porous metal foam heat sinks 86 placed therebetween. The FIG. 5B representation for a radial transverse flow assembly 80 within a portion of a casing wall structure 76 with a central coolant inlet 82 was earlier seen to represent a discrete type of radial coolant passage. The annular outlet cavity 84a, 84b for coolant flow has been described to take place through the grooves or channels 58 in the upper and lower interfacing surfaces of the modified heat sink elements 50′, assembled from the stack assembly of FIG. 4B. The FIG. 5B assembly is likewise seen in the differential mode to represent outward radial flow in all directions through the replacement of heat sinks 50′ with porous metal disks 86 of the FIG. 5C stack assembly. The porous metal foam disks 86 allows radial flow in every radial transverse direction when supplied from the central coolant inlet 82, there is direct heat transfer surface contact with the unpackaged semiconductor fusions 60 circulating through the annular outlet cavity 84.

There is a characteristic common to all of the above stack assemblies utilizing unpackaged semiconductor fusion elements in the various modified alternatives shown in FIGS. 3A, 3B, 4B and 5C, along with the modified heat sink elements of FIGS. 4A, 4B, 4C and 5C in either the parallel transverse flow assembly mode of FIG. 5A and the radial transverse flow assembly of FIG. 5B. Each of these stack assembly configurations provide for alternative modular stack units, each of which is usable in the following description with respect to high power density semiconductor modules which they form a part of as represented in FIG. 6, next to be described, as well as FIG. 8, which integrates all of the best features of FIG. 6 and provides the most compact modular arrangement.

Referring to FIG. 6, this figure shows an assembled high power density semiconductor module 90 which is adapted for axial coolant flow through finned heat sink elements and is modularly scaled to all power levels required for current and future aviation, marine, and space mission electrical power generation requirements, using respective low viscosity insulating oil or cryogenic cooling fluids according to the following description. A pressure casing shell 92 is formed of an insulating material such as Micarta ™ as it is known of the type G-10. A closed casing end 94 is adapted to serve as an electrical terminal end for the module which is opposed to a flared casing end 96. The casing end 96 is adapted to be sealed by a base cover assembly 100 which serves as an opposite electrical terminal configuration with opposite electrical polarities occurring between the terminal positions. A plurality of cover assembly screws at spaced radial displacement 102a through 102h are used to seal the base cover assembly 100 to the flared casing end 96 at a cover seal fitting 103 in order to provide a resealable fluid type cavity for the module.

An electrode plate 104 is butted into the closed casing end interior 94 with a terminal bolt 106 emerging through a hole central to the closed casing end 94 while providing a fluid tight seal therewith. Terminal fasteners 108a, 108b are screw threaded over the screw thread end 110 of the terminal bolt 106 in order to provide a connection with a bus bar (not shown) of one electrical polarity at this end of the module 90. A base electrode disk 112 is within the flared casing end 96 with a centrally located terminal base bolt 114 slidably fitted through a centrally drilled hole in the base cover assembly 100 which may be machined or die cast aluminum. The terminal base bolt 114 emerges from the bottom of the base cover assembly 100 as a threaded end 118 with a pair of base terminal fasteners 116a, 116b which are adapted to fasten to a bus bar having the opposite electrical polarity to that associated with the upper casing terminal bus bar connection (not shown).

The base electrode disk 112 supports a modular stack assembly which is located within a casing interior cooling space 120 which extends through the pressure casing 92 into the closed casing end 94. The insertion of the base electrode disk 112 is with the base cover assembly 100 on which it is supported on its down facing surface 124 by a plurality of set screws 122a through 122f. When these screws 122 are fully inserted they extend into the casing interior 120 to provide a compression force platform which acts through the lifting movement of the base electrode disk 112. This assembly serves as a rigid support surface against the stack assembly lower surface extremity 126e which is formed by the lowermost heat sink element of an assembled stack of interleaved heat sink elements 126a, 126b, 126c, 126d, completed by the semiconductor fusion elements 40a, 40b, 40c and 40d therebetween. The top surface of heat sink element 126a then interfaces with the downwardly facing surface of the electrode plate 104.

This arrangement provides that the base cover assembly 100 supporting the interleaved semiconductor fusion stack assembly is inserted into the shell of the casing 92 and fastened solidly thereto with the cover assembly screws 102a-102h. The next step in the assembly is to torque tighten the set screws 122a-122f in opposing succession in order to lift the base electrode disk 112 against the assembled stack thereabove it. This applies a uniformly distributed compressive force over the faces of all the interfacing elements of the semiconductor fusion elements 40 and the heat sink elements 126 positioned therebetween. A force of 1000 to 2000 psi is exerted to assure that a very rigid mechanical stack and low resistance electrical path exists during operation through the power semiconductor module from one terminal end 110 to the other terminal end 118.

Each of the heat sink elements 126, when it is compressed, assumes a vertical stack position within the pressure casing shell 92 which is centered on a hole drilled and tapped through the Micarta G-10 shell. Each hole is in a position adapted to receive, for example, a threaded terminal contact 146a which is inserted so as to make electrical contact with the like positioned heat sink element 126a to thereby serve as a terminal point. This terminal point is a point from which a network pair of elements, capacitor 142a connected in electrical circuit parallel with a resistor 144a, is connected in ladder-like fashion, contributing to a snubber network connected across the respective semiconductor fusion elements 40. This is more clearly seen as represented in the electrical circuit schematic shown in FIG. 7 which identifies the network of elements connected in parallel with the respective diodes 40 representing the semiconductor fusion elements 40a, 40b, 40c, 40d, which are physically located within the pressure casing shell 92 of FIG. 6.

Figure 7:
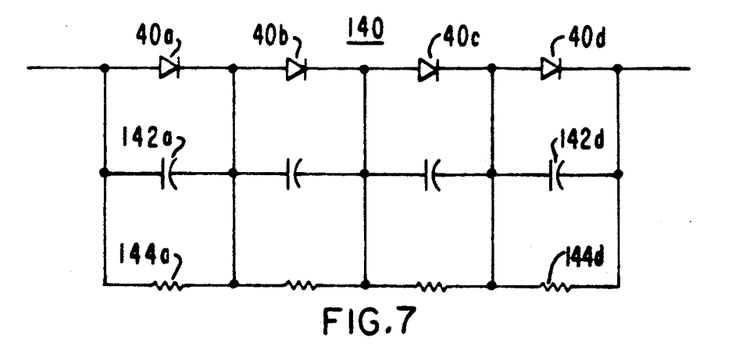
FIG. 7 is an electrical schematic view of the FIG. 6 snubber network of elements connected in parallel with diodes representing individual semiconductor fusion elements.

The network of resistors 144 provides that the voltage between the terminal connections 110, 118 is divided equally between the semiconductor fusion elements which are represented by the diodes 40. Similarly, the capacitors 142 in the network arrangement 140 are all substantially of equal capacitive values so that the voltage division which occurs during a switching transient is equally divided among the semiconductor diode elements 40. This is to insure desirable switching characteristics are provided as well as steady state uniformity for same. These resistive and capacitive elements also limit the peak voltage across the diode devices and reduce switching losses so as to prevent failure from voltage transients that would exceed the rate of blocking voltage. Voltage clamping with an alterative electrical network of metal oxide varistors (MOVs) can also be used for this function. While it is desirable for some purposes to eliminate snubber networks, there is justification in their use in order to avoid making larger or higher voltage rated power semiconductor components when lesser ones will do the job suitably well.

Capacitors 142 must be designed when it is relevant from use, to survive cryogenic temperatures and/or temperature cycling to room temperature when cryogen coolant is chosen for this purpose. The snubber network 140 of FIG. 6 is contained within the dashed rectangle which represents a containment for a cooling bath of oil or a cryogen fluid which is circulated in an auxiliary cooling passage. This containment is very proximate to the casing interior 120 so as not to introduce long connective inductive loops which would deteriorate the performance of the capacitive snubber network 142. Oil filled capacitors are useful in a natural oil cooled environment and generate low losses of insignificance when compared with the heat dissipated in the coolant circulating passed the central electrical fusion power.

The structure for the high power density semiconductor module 90 further includes a cooling inlet tube 132 which is inserted into an inlet passage 133 formed or bored in the base cover assembly 100. The inlet passage 133 makes a horizontal to vertical turn in order to provide access into the casing interior space 120. The cooling inlet tube 132 forms a fluid tight sealed connection with the inlet passage 133, and this is accomplished either by tapping and threading for the cooling inlet tube 132 or otherwise by bonding or gluing this joint. An appropriate temperature range glue is used in order to insure safe operation at the relevant operating temperatures and to avoid leaks caused by thermal stress recycling. A nipple 134 is similarly connected to the cooling inlet tube 132 in order to provide a removable cooling connection for a coolant line (not shown) to input the coolant into the casing interior annular space 120. An outlet tube 136 is provided for the pressure casing shell 92 near the closed casing end 94, and it is fastened with similar bonding means or screw threads. A nipple 138 serves to connect the outlet to a return line (not shown) for the circulation path to which the coolant returns to transfer the heat from the direct transfer with the interior elements of the pressure casing 92.

The coolant fluid is an electric insulator in that it has a dielectric constant in the appropriate value range chosen for the terminal voltage characteristics for a specific high power density semiconductor module. The cooling system of the high power density module integrates the cooling and insulation functions by the proper choice of cooling fluid which is forced to circulate. A finned or slotted peripheral structure is provided in each of the metal heat sink elements 126e–126a. The rising or upthrusting direction of coolant flow passes through the fins or slots and courses through the interleaved semiconductor fusion elements 40d towards 40a before reaching the uppermost annular passageway surrounding the closed end electrode plate 104. Axial coolant flow in this stack assembly configuration, passing through the space between the fins and the plural heat sink elements, is another variation in the manner in which axial coolant flow paths are arranged according to the invention. The return of the cooling fluid through the outlet tube 136 provides the means for passing the coolant to a refrigerator or heat exchanger with another heat transfer medium which can be used to recycle the coolant a sufficient number of degrees with the next heat transfer cycle from the pressure casing 92.

One of the best, although one of the most unlikely coolants, thought not to be suitable, but instead found to have the duality with excellent electrical insulating properties, is supercritical liquid hydrogen $SLH_2$. It has a dielectric capability of 200 volts/mil and provides extremely efficient direct cooling of the unpackaged semiconductor fusions required for high voltage stack assemblies. An exemplary capability with parameters of 10 KV up to 50 KV and 3 KA providing a power output of 30 MW, with a temperature operation range of 200° when operating from 20° K., to provide an excellent example of use for space mission electrical power systems. Moreover, the achievement of these parameters is with great savings in weight since the weight to power ratio is 0.6 Kg/MW (1.3lbs/Mw). Approximately 18 Kg (40 lbs.) would be the weight of the scaled module shown in FIG. 6 which is approximated to use modified unpackaged $R_7$ semiconductor fusions 40. These are approximately 1.25 inches (3.2 cm) in diameter, and by using the same semiconductor fusion elements as shown in FIG. 6 with larger heat sinks 126 and a larger interior coolant space in the casing interior 120, this provides the capability to get the same heat transfer using a low viscosity oil. p FLUORINERT TM us a good electric voltage breakdown insulator in the range of 200 volts/-mil. The cooling oil approach uses the same configuration described in FIG. 6 which is scaled upward, and the high power density semiconductor module 90 provides a ratio of weight to power output in the range of 1 Kg/MW (2.2 lbs/MW) although the weight of the unit becomes approximately 30 Kg (66 lbs.) which is tending to double the weight of the configuration used with $SLH_2$. This weight is still far lower than the state of the art calculated weight of 390 Kg (858 lbs.) for a system using not any of the features of the present invention and which has the weight to power ratio in the range of 13 Kg/MW (28.6 lbs/KW) which is still considered useful.

The temperature range of cooling with oil is much more restricted than operational cooling with $SLH_2$ since 50° to 100° C. is usually the limit with oil. This range is determined by the maximum temperature which the semiconductor fusions will operate at, and in this case, it is a much lower range than for $SLH_2$, since the starting temperature of 50° C. is far higher than it is at 20° K. for the cryogen.

Referring now to FIG. 8, a further integrated high power density semiconductor module 150 is shown with axial coolant flow along annular concentric paths about the electrode axis. A pressure case 152 is designed to contain the flow of oil or coolant $SLH_2$ at 200 psi within the interior cavity formed by mating a flared case end 154 with a cover plate 158 through a pressure seal 156. A modular stack assembly 160 of interleaved fusion elements and heat sink elements is inserted into the pressure case 152 through the flared case open end 154 and into the central core therewithin. The assembly 160 communicates electrically by way of an input electrical lead 162 and an output lead 164 which are connected to upper and lower bus bars (not shown) for an electrical power generating system.

The stack assembly 160 does not, in this configuration, need to depend on the pressure case 152 for a compression tube function for the stack assembly 160. This is in contrast with the high power density module shown in FIG. 6 which relies on the structural integrity of the pressure casing 92 for functional compression which can accommodate the range of 1000 to 2000 or more psi for the stack assembly. A clamping plate 166 is part of the stack assembly 160 which permits the stack assembly to be an integral self supporting compression unit for the fusion elements and heat sink elements interleaved therein. This may take the structural form of a semiconductor fusion element assembly modular stack unit which forms the subject matter of the previously mentioned, concurrently filed copending U.S. patent application Ser. No. 07/569,113 (W.E. 55,515).

The pressure case 152 is configured with an axial case inlet 168 and an axial case outlet 72 for introducing and expending the cooling fluid oil or $SLH_2$ after traversing intermediate radial and annular concentric paths. The axial coolant flow through and around the stack assembly takes the transverse radial path flow described as shown in FIGS. 3B, 4B, 5B and 5C. The integral structure of the pressure case 152 provides an annular chamber 170 in which are located pairs of resistor and capacitor electrical parallel network combinations 142b', 144b' and 142c', 144c', which constitute part of the symmetrical snubber network arrangement as previously described. The coolant flow path is such that a small portion of the coolant is diverted or siphoned off into the chamber 170 so that the proximate location of the snubber components does not introduce any relevant inductance loop contribution. The high power density module operation is thus relieved from deterioration in performance it would experience if the snubber components were located at greater distances from the connection with the heat sink elements.

The relatively small size and slim silhouette of the high power density modules of FIGS. 6 and 8, along with the fuse-like changeability for repair or replacement of the stack assembly, as well as the fuse-like insertability of the modules 120 and 150 themselves in a power generating system environment. establishes this modular design as masterpiece of functional capability. Operation in the relevant temperature range for oil of 50° to 100° C. or 20°-200° K. for the coolant $SLH_2$, provides the superior advantage in size and weight, but each module also could be easily repackaged by scaling as described to have a slightly greater cooling capacity. This proportioning is such that it would serve ideally with modularity of design for electronic ship drives, with snap on fittings which are provided for the electrical and cooling connections. More than an order of magnitude reduction in size and weight is achieved over what is currently in use and considered by many persons, to be state of the art.

What is claimed is:

1. A power semiconductor module nesting a fusion element assembly and electrically insulating and operatively cooling at least one of a plurality of semiconductor fusion elements, said semiconductor module comprising:

an insulator casing with an integral surface shell having a closed end and another end enclosing a stack unit so as to bathe said semiconductor fusion elements in said stack unit with a supercritical cryogenic fluid chosen for combined thermal transfer and electrical isolation for protecting the fusion elements from voltage breakover conducting paths;

said casing including a first conductive terminal at said closed end connecting an electrical conduction path through the surface of said casing into an interior chamber;

a resealable cover assembly at the other end of said casing to contain the fluid to pass through a path within said casing, said cover assembly including a second conductive terminal communicating into the interior chamber of said casing, said cover assembly being set in place to provide an electrically conductive path between said first and second terminals;

a stack unit with two ends, said stack being assembled for interleaving said semiconductor fusion elements with a plurality of heat sink elements to compressively load the facing surfaces of said fusion elements and heat sink elements with respect to each other with electrically conductive transfer between said first and second terminals, said fusion elements and said heat sink elements being bathed with an insulating fluid coolant to transfer the electrical heat from said operative semiconductor fusions to the external environment;

said casing further having an inlet port and an outlet port to its interior chamber for the circulation path of the coolant which is a dielectric cryogen having combined functional efficacy of heat transfer and electrical insulation from conducting paths.

2. The power semiconductor module as set forth in claim 1, wherein said fluid with said combined functional efficacy of cooling and insulating said modular stack unit is supercritical liquid hydrogen being circulated through said casing before being expended.

3. The power semiconductor module as set forth in claim 1, wherein said single fluid with said combined functional efficacy of cooling and insulating said modular stack unit is a cryogen wherein send cryogen is selected from the group consisting of neon, nitrogen, and helium having good dielectric properties and having good recirculation heat transfer capabilities.

4. The power semiconductor module as set forth in claim 1, wherein said stack unit includes a preloadable centralized clamping apparatus inserted through each fusion element having a centralized aperture aligned and associated with centrally bored heat sink elements for minimizing the requirements associated with non-apertured fusion elements otherwise packaged within "hockey puck" based structures.

5. The power semiconductor module as set forth in claim 1, wherein said stack unit of fusion elements and heat sink elements being compressively preloaded for becoming operative when said cover assembly is sealed to said casing and being adjustable to a predetermined compressive loading of said interfaced semiconductor fusions up to predetermined elevated magnitudes of force.

6. The power semiconductor module as set forth in claim 1, wherein said one or more semiconductor fusion elements includes a polarized wafer thin semiconductor element bonded to a metal backing plate member to provide mechanical support for said polarized element, said backing plate member having at least one transverse groove traversing its outer face to transfer said single fluid under a pressure head communicating through the clearance from the interior shell of said casing so as to pass through the core of said stack in order to transfer the heat of the semiconductor fusion element to the external environment.

7. The power semiconductor module as set forth in claim 6, wherein each set of said plurality of polarized elements having anode and cathode oppositely facing surfaces with corresponding opposite electrical polarity, one of said facing surfaces facing a first heat sink member, and the other facing surface of said first polarized element interfacing a second heat sink member through the backing plate member.

8. The power semiconductor module as set forth in claim 6, wherein said transverse grooves through the exterior face of said backing plate are parallel channels and said grooves laterally extend from one side extent to the other side extent of said backing plate.

9. The power semiconductor module as set forth in claim 6, wherein said transverse grooves through the exterior face of said backing plate are radial channels, and said grooves emanate from a central aperture formatted into the fabrication process of said polarized semiconductor in alignment with a central aperture formed in said backing plate to which the semiconductor is bonded.

10. The power semiconductor module as set forth in claim 1 wherein said semiconductor fusion elements includes a polarized wafer thin semiconductor element bonded to a metal backing plate member to provide mechanical support for said polarized element, said plurality of heat sink elements including at least one heat sink element formed of a porous metal foam of rigid supporting configuration to withstand the compressive loading of the stack unit within said casing, and thereby to transfer said single fluid under a pressure head communicating through the clearance from the interior shell of said casing to pass through the core of said stack in order to transfer the heat of the semiconductor fusion element to the external environment.

11. The power semiconductor module as set forth in claim 10, wherein each of said plurality of said polarized elements having anode and cathode oppositely facing surfaces with corresponding opposite electrical polarity, one of said facing surfaces facing a first heat sink member formed of said porous metal foam, and the other facing surface of said first polarized element interfacing a second heat sink member through the backing plate member.

12. The power semiconductor module as set forth in claim 10 wherein said one of said plurality of heat sink elements formed of a porous metal foam being centrally apertured while providing a supporting configuration to withstand the compressive loading of the stack unit within said casing, and thereby to transfer said single fluid under a pressure head communicating through the central aperture with the clearance from the interior shell of said casing so as to pass through the core of said modular stack in order to transfer the heat of the semiconductor fusion element to the external environment.

13. The power semiconductor module as set forth in claim 1, wherein at least one of said plural heat sink elements being formed to have at least one transverse grooves traversing one of its outer faces to transfer said single fluid under a pressure head communicating through the clearance from the interior shell of said casing so as to pass through the core of said modular stack, and said semiconductor fusion elements includes a polarized wafer thin semiconductor element bonded to a metal backing plate member to provide mechanical support for said polarized element, each set of said plurality of said polarized elements having anode and cathode oppositely facing surfaces with corresponding opposite electrical polarity, one of said facing surfaces facing said heat sink member surface face with transversely cut grooves in order to transfer said single fluid, and the other facing surface of said first polarized element interfacing a second heat sink member through the backing plate member.

14. The power semiconductor module as set forth in claim 13, wherein said second heat sink member is similarly formed as the first heat sink member having at least transverse groove traversing one of its outer faces to transfer said single fluid, and said second heat sink member has said transversely grooved face interfacing with the other facing surface of said first polarized element through the outward facing surface of the backing plate member.

15. The power semiconductor module as set forth in claim 13, wherein said heat sink member is formed to have said at least one transverse groove through one of its outward facing surfaces in parallel channels, and said grooves are laterally extending from one side extent to the other side extent of said heat sink member.

16. The power semiconductor module as set forth in claim 13, wherein said heat sink member is formed to have said at least one transverse groove through the both of its outward facing surfaces in parallel channels, and said grooves are laterally extending from one side extent to the other side extent of said heat sink member.

17. The power semiconductor module as set forth in claim 16, wherein said transverse grooves in parallel channels in each of the outwardly facing surfaces of said at least one heat sink member are offset with respect to the transverse grooves in the other outwardly facing surface of said heat sink member.

18. The power semiconductor module as set forth in claim 13, wherein said transverse grooves through the exterior face of at least one heat sink member are radial channels and said grooves emanate from a central aperture formed into the heat sink member in alignment with a central aperture formatted in the fabrication of said polarized semiconductor being also in alignment with a central aperture formed in said backing plate to which the semiconductor is bonded.

19. The power semiconductor module as set forth in claim 13, wherein said transverse grooves through the exterior face of at least one heat sink member are radial channels, and said grooves emanate on both outwardly facing surfaces from a central aperture formed into the heat sink member in alignment with a central aperture formatted in the fabrication of said polarized semiconductor which is also in alignment with a central aperture formed in said backing plate to which the semiconductor is bonded.

20. The power semiconductor module as set forth in claim 19, wherein each of said grooves emanating on one outwardly facing surface from the central aperture in the heat sink member are imposed on a radial in clock face degrees which is displaced from each of the grooves emanating on the other oppositely facing surface of the heat sink member also being fed from the central aperture.

21. A power semiconductor containment for utilizing a cryogen as a functional coolant for a semiconductor fusion element for said containment, said cryogen also serving as an extraordinary electrical insulator for said semiconductor fusion element with said containment.

22. The power semiconductor containment utilizing a cryogen as in claim 21, wherein said cryogen is selected from the group consisting of helium, hydrogen, neon and nitrogen.

23. A power semiconductor containment for utilizing supercritical liquid hydrogen (SLH$_2$) as a functional coolant for a semiconductor fusion element for said containment, said liquid hydrogen also serving as an extraordinary electrical insulator for said semiconductor fusion element with said containment.

* * * * *